United States Patent
Szmanda et al.

(10) Patent No.: US 7,214,410 B2
(45) Date of Patent: May 8, 2007

(54) PROCESS FOR SELECTING SOLVENTS FOR FORMING FILMS OF FERROELECTRIC POLYMERS

(75) Inventors: Charles R. Szmanda, Westborough, MA (US); Kathleen B. Spear-Alfonso, Hudson, MA (US); Lujia Bu, Shrewsbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/674,617

(22) Filed: Sep. 30, 2003

(65) Prior Publication Data

US 2004/0131862 A1 Jul. 8, 2004

(51) Int. Cl.
*B05D 3/02* (2006.01)
*B05D 3/06* (2006.01)
(52) U.S. Cl. .................. 427/385.5; 427/551
(58) Field of Classification Search ........ 428/421, 428/411.1; 526/250, 255; 524/104, 113, 524/191, 205, 355, 360, 545; 427/385.5, 427/551

See application file for complete search history.

(56) References Cited

U.S. PATENT DOCUMENTS

| | | | | |
|---|---|---|---|---|
| 4,335,226 A | * | 6/1982 | Muller et al. | 525/281 |
| 5,541,747 A | * | 7/1996 | Nishi et al. | 349/49 |
| 5,679,753 A | * | 10/1997 | Ohigashi et al. | 526/255 |
| 6,355,749 B1 | * | 3/2002 | Chung et al. | 526/255 |
| 6,423,412 B1 | * | 7/2002 | Zhang et al. | 428/421 |
| 6,686,211 B1 | * | 2/2004 | Asakawa | 438/3 |

* cited by examiner

*Primary Examiner*—Ramsey Zacharia
(74) *Attorney, Agent, or Firm*—Peter F. Corless; Darryl P. Frickey; Edwards Angell Palmer & Dodge LLP

(57) ABSTRACT

Disclosed herein is a process of forming a ferroelectric polymer film from a solution, wherein the solvent composition is selected so as to adjust the properties of the film. Films formed by this method have improved properties, particularly with respect to roughness and crystal domain size.

14 Claims, 3 Drawing Sheets

Figure 1

| Molecular Compound | Flash Point, °F CC | Normal Boiling Point, °C 760 mm Hg | Evaporation Rate, 25°C NBAC=1.00 | Solubility parameters, [cal/cc]^1/2 (multiply by 2.046 for [J/cc]^1/2) | | | | |
|---|---|---|---|---|---|---|---|---|
| | | | | SPo | SPd | SPp | SPh | SPv |
| Acetonitrile | 42 | 82 | 2.33 | 11.9 | 7.5 | 8.8 | 3.0 | 11.56 |
| Benzonitrile | 161 | 188 | 0.065 | 9.7 | 8.5 | 4.4 | 1.6 | 9.57 |
| gamma-Butyrolactone | 209 | 204 | 0.03 | 12.8 | 9.3 | 8.1 | 3.6 | 12.33 |
| Chlorobenzene | 75 | 132 | 1.15 | 9.6 | 9.3 | 2.1 | 1.0 | 9.53 |
| Chloroform | NONE | 61 | 10.2 | 9.3 | 8.7 | 1.5 | 2.8 | 8.83 |
| Cyclohexanone | 116 | 155 | 0.3 | 9.6 | 8.7 | 3.1 | 2.5 | 9.24 |
| o-Dichlorobenzene | 150 | 179 | 0.165 | 10.0 | 9.4 | 3.1 | 1.6 | 9.90 |
| Diethyl carbonate | 88 | 126 | 0.97 | 8.8 | 8.1 | 1.5 | 3.0 | 8.24 |
| Diglyme (diethylene glycol dimethyl ether) | 158 | 162 | 0.15 | 9.4 | 7.7 | 3.0 | 4.5 | 8.26 |
| N,N-Dimethylformamide | 136 | 153 | 0.2 | 12.1 | 8.5 | 6.7 | 5.5 | 10.82 |
| Di-n-propyl carbonate | 147 | 165 | 0.15 | 8.8 | 7.6 | 2.0 | 3.9 | 7.86 |
| EC-50 (TEXACAR® EC-50, a 50/50 by weight blend of ethylene and propylene carbonate) | 310 | 239 | 0.005 | 13.9 | 9.6 | 9.8 | 2.2 | 13.72 |
| EEA (ethylene glycol ethyl ether acetate) | 135 | 156 | 0.19 | 9.6 | 7.8 | 2.3 | 5.2 | 8.13 |
| EEP (ethyl-3-ethoxypropionate) | 136 | 165 | 0.12 | 10.2 | 7.9 | 4.5 | 4.6 | 9.09 |
| Ethyl cellosolve, ethylene glycol monoethyl ether, Polymer Handbook - III | 115 | 124 | 0.53 | 11.5 | 7.9 | 4.5 | 7.0 | 9.11 |
| Ethylene carbonate (TEXACAR EC) (mp 37°C) | 320 | 248 | 0.005 | 14.5 | 9.5 | 11.0 | 2.5 | 14.53 |
| Ethyl lactate(S)-(-) | 120 | 154 | 0.214 | 10.6 | 7.8 | 3.7 | 6.1 | 8.63 |
| Glyme(ethyleneglycoldimethylether) | 32 | 85 | 4.02 | 8.4 | 7.4 | 1.3 | 3.7 | 7.51 |
| Methyl iso-amyl ketone | 106 | 145 | 0.46 | 8.5 | 7.8 | 2.8 | 2.0 | 8.29 |
| Methyl-n-amyl-ketone | 117 | 149 | 0.34 | 9.7 | 7.9 | 2.7 | 4.9 | 8.35 |
| Methylene chloride | NONE | 40 | 14.5 | 9.9 | 8.9 | 3.1 | 3.0 | 9.42 |
| N-Methyl-2-pyrrolidinone | 187 | 202 | 0.03 | 11.2 | 8.8 | 6.0 | 3.5 | 10.65 |
| PM (propyleneglycol methylether) (Dowanol PM) | 93 | 118 | 0.814 | 12.2 | 7.8 | 4.6 | 8.0 | 9.06 |
| PMA (propylene glycol methyl ether acetate) | 115 | 140 | 0.368 | 9.6 | 8.9 | 1.8 | 3.0 | 9.08 |
| 2-Pyrrolidinone | 230 | 245 | 0.001 | 13.9 | 9.5 | 8.5 | 5.0 | 12.75 |
| Tetrahydrofuran | 1 | 67 | 6.3 | 9.5 | 8.2 | 2.8 | 3.9 | 8.66 |

Figure 2
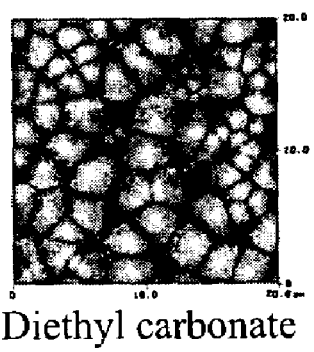
Diethyl carbonate
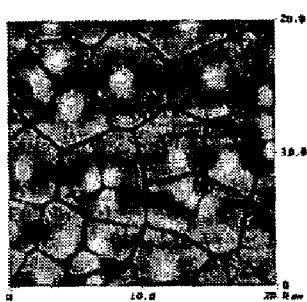 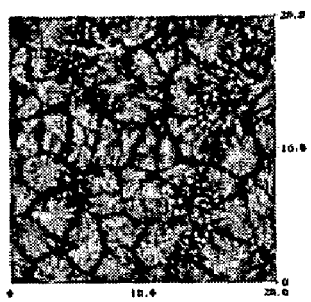 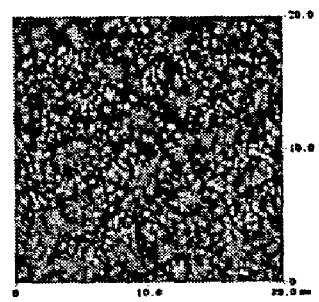
2-heptanone          Ethyl lactate          PGMEA

PROCESS FOR SELECTING SOLVENTS FOR FORMING FILMS OF FERROELECTRIC POLYMERS

BACKGROUND

The present invention relates to a process for selecting solvents for forming films of ferroelectric polymers, the solvents selected, a composition for forming ferroelectric polymer films, and the films formed therewith, and in particular, ferroelectric polymer films suitable for use in a data processing device.

Ferroelectrics are a class of dielectric materials that can be given a permanent electric polarization by application of an external electric field. Use of ferroelectric materials in data processing devices is disclosed in U.S. Patent Application No. U.S. 2002/0044480 to Gudesen et al., which is directed to a ferroelectric data processing device comprising a thin film of ferroelectric material as a data-carrying medium. The film may be inorganic, a ceramic material, a polymer, or a liquid crystal. Gudesen does not, however, disclose how ferroelectric films are made. Use of ferroelectric polymers in data processing devices is also described, for example, by Y. Tajitsu et al., in "Investigation of Switching Characteristics of Vinylidene Fluoride/Trifluoroethylene Copolymers in Relation to Their Structures", (Japanese Journal of Applied Physics, Volume 26, pp. 554–560, 1987).

Formation of ferroelectric films is disclosed in published U.S. Patent Application No. US 2002/0037399 and U.S. Patent Application No. 2002/0051879, both to Tamai et al, which are directed to forming ferroelectric films, including organic polymer films, that also contain microparticulates. These references state that the solvents used in forming a film is not critical (see paragraph [0054] and [0050], respectively).

In contrast, it is known that only certain vinylidene fluoride polymers are ferroelectric, and the presence of ferroelectricity is due at least in part to the history of the film, including the thermal history of the film and the solvent used to form the film. See, e.g., the Abstract of an article by Cho, in *Polymer*, Volume 15, p. 67 (1991). Recently, Tashiro et al., in Macromolecules, Volume 35, p. 714 (2002) performed a detailed structural analysis of the various vinylidene fluoride crystal morphologies. Vinylidene fluoride polymers occur in four distinct crystal morphologies, all monoclinic. Without intending to bound by theory, form I has essentially planar zigzag chains forming a polar structure in which $CF_2$ dipoles are parallel to each other along the crystallographic b-axis. The chains are tightly packed and tend to form large crystals. In form II, the $CF_2$ dipoles are packed in anti-parallel mode along the b-axis. Form II is therefore nonpolar and less tightly packed than form I. Form III is also a tightly packed polar unit cell, and is obtained by casting from highly polar (but not necessarily hydrogen bonding) solvents such as dimethylacetamide or dimethylformamide. Form III may also be obtained by annealing forms II or IV at high temperature. Finally, form IV is a polar structure in which the chains are packed in parallel mode. Form IV is also a desirable form from the standpoint of ferroelectric properties because it can interconvert with form II. Copolymers of vinylidene fluoride exhibit similar characteristics.

In addition to ferroelectricity, a number of other properties are important in the function and use of ferroelectric polymer films, including properties related to hysteresis (including saturation potential, coercive field strength, and permittivity); reliability (such as fatigue, aging, time dependence dielectric breakdown, imprint, and relaxation); and thermodynamic properties such as the Curie transition temperature of the film. Many factors can affect these properties, for example the composition of the polymers, and historical factors such as the heat load applied to a particular film, the process of by which a film is made, the solvent used to make a film, and mechanical stresses applied to the film, and the like. There accordingly remains a need in the art for methods for the manufacture of ferroelectric polymer films, in particular films suitable for use as memory devices, that are highly reproducible and that allow control of the properties of the film.

STATEMENT OF THE INVENTION

In one aspect of the present invention, there is provided a process of forming a ferroelectric polymer film, comprising disposing a solution comprising a solvent composition and a ferroelectric polymer film precursor composition onto a substrate, and removing at least a portion of the solvent to produce the ferroelectric polymer film, wherein the solvent has a $\delta_v$ value of greater than or equal to 8.5 $(cal/cc)^{1/2}$, $\delta_v = (\delta_d^2 + \delta_p^2)^{1/2}$, $\delta_d$ is a Hansen dispersive solubility parameter, and $\delta_p$ is a Hansen polar solubility parameter. Parameters were obtained from a standard solvent property chart available from Texaco Chemical Company.

In another aspect, there is provided a process for selecting a solvent composition for forming a ferroelectric polymer film, comprising selecting a solvent composition having a $\delta_v$ value of greater than or equal to 8.5 $(cal/cc)^{1/2}$, wherein $\delta_v = (\delta_d^2 + \delta_p^2)^{1/2}$, $\delta_d$ is a Hansen dispersive solubility parameter, and $\delta_p$ is a Hansen polar solubility parameter.

In yet another aspect, a solvent composition for forming a ferroelectric polymer film comprises a solvent composition having a $\delta_v$ value of greater than or equal to 8.5 $(cal/cc)^{1/2}$, wherein $\delta_v = (\delta_d^2 + \delta_p^2)^{1/2}$, $\delta_d$ is a Hansen dispersive solubility parameter, and $\delta_p$ is a Hansen polar solubility parameter.

In still another aspect, a ferroelectric film comprises a layer of ferroelectric polymeric material formed from a solution comprising a solvent composition and a ferroelectric polymer film precursor composition, wherein the solvent has a $\delta_v$ value of greater than or equal to 8.5 $(cal/cc)^{1/2}$, $\delta_v = (\delta_d^2 + \delta_p^2)^{1/2}$, $\delta_d$ is a Hansen dispersive solubility parameter, and $\delta_p$ is a Hansen polar solubility parameter.

In still another aspect, there is provided a composition for forming a ferroelectric polymer film, comprising a ferroelectric polymer film precursor composition and a solvent composition, wherein the solvent has a $\delta_v$ value of greater than or equal to 8.5 $(cal/cc)^{1/2}$, $\delta_v = (\delta_d^2 + \delta_p^2)^{1/2}$, $\delta_d$ is a Hansen dispersive solubility parameter, and $\delta_p$ is a Hansen polar solubility parameter.

In yet another aspect of the invention, there is provided a data processing device comprising a ferroelectric polymer film formed from a solution comprising a solvent composition and a ferroelectric polymer film precursor composition, wherein the solvent has a $\delta_v$ value of greater than or equal to 8.5 $(cal/cc)^{1/2}$, $\delta_v = (\delta_d^2 + \delta_p^2)^{1/2}$, $\delta_d$ is a Hansen dispersive solubility parameter, and $\delta_p$ is a Hansen polar solubility parameter; and wherein the ferroelectric polymer film is a continuous layer in or adjacent to a first electrode structure and a second electrode structure, the first electrode structure and the second electrode structure each comprising substantially mutually parallel strip electrodes such that the electrode structures mutually form a substantially orthogonal x, y matrix, and a portion of the ferroelectric polymer film at an intersection between an x electrode and a y electrode of the electrode matrix forms a logic element electrically connected to form the data processing device.

DESCRIPTION OF THE DRAWINGS

FIG. 1 is excerpted from the Texaco Solvent Characteristics Chart available from Texaco Chemical Company;

FIG. 2 depicts atomic force microscopy images of ferroelectric films in accordance with the present invention.

DETAILED DESCRIPTION

Figure 3:
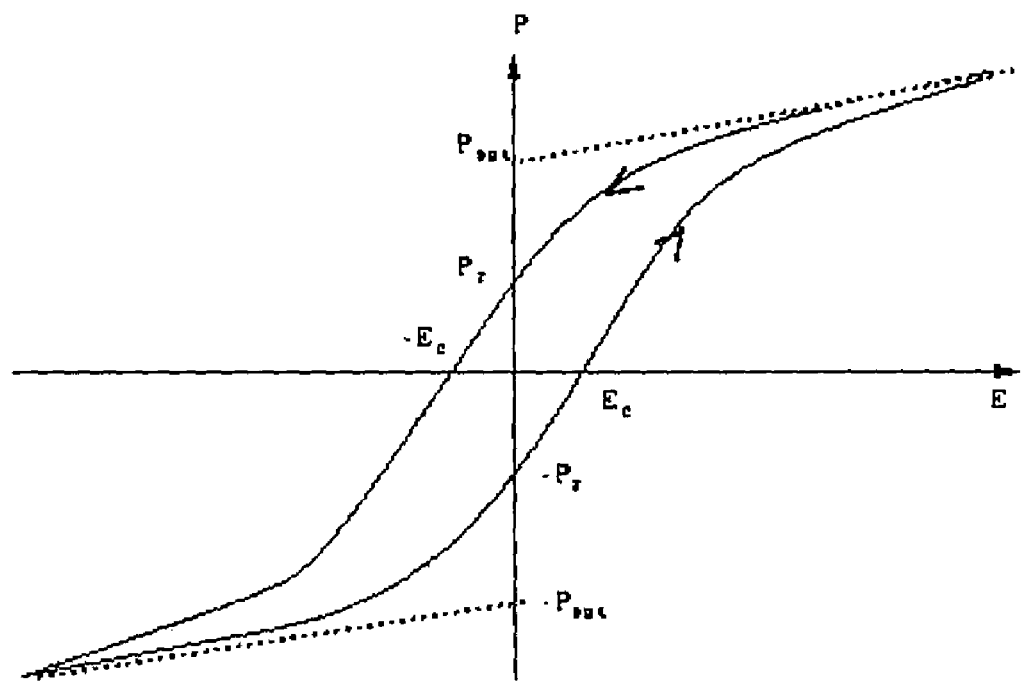
FIG. 3 depicts a hysteresis loop for a ferroelectric polymer film comprising a copolymer of vinylidene fluoride and trifluoroethylene in a molar ratio of about 80/20.

The ferroelectric polymer film precursor composition comprises an organic ferroelectric polymer or prepolymer. Organic polymers that display ferroelectric properties and that are suitable for the formation of ferroelectric polymer films are formed from one or more polymerizable monomers such as vinylidene fluoride, tetrafluoroethylene, trifluoroethylene, chlorotrifluoroethylene, hexafluoropropene, vinylidene chloride, vinyl fluoride, and vinyl chloride. Other monomers may also be present to adjust the properties of the final film, for example, acrylonitrile, acrylamide, methyl methacrylate, ethyl methacrylate, butyl methacrylate, octyl methacrylate, methacrylic acid, methyl acrylate, ethyl acrylate, butyl acrylate, octyl acrylate, 2-hydroxyethyl acrylate, glycidyl acrylate, acrylic acid, maleic anhydride, vinyl acetate, styrene, alpha-methyl styrene, trimethoxyvinylsilane, triethoxyvinylsilane, norbornene, butadiene, and the like. Oligomers and pre-polymers such as poly(vinylidene fluoride and ethylene-tetrafluoroethylene alternating copolymer may also be used. These polymerizable monomers can be used either singly, or as a combination of two or more co-monomers, such as terpolymers, and tetrapolymers.

The above-described additional monomers may be present in amounts of less than or equal 50 mol %, preferably less than or equal to 30 mol % of the total polymer. When present, they are generally included in amounts of greater than or equal to 0.5 mol %, preferably greater than or equal to 1 mol %, more preferably greater than or equal to 2 mol % of the total polymer.

Preferably, the ferroelectric polymer or prepolymer comprises vinylidene fluoride, which may be copolymerized with trifluoroethylene, hexafluoropropylene, or both. Vinylidene fluoride is present in a concentration of 10 to 100 mole percent (mol %), based on the total weight of the ferroelectric polymer. Within this range, a vinylidene fluoride concentration of greater than or equal to 50 mol % can be employed, with greater than or equal to 70 mol % preferred. Also preferred within this range is a vinylidene fluoride concentration of less than or equal to 90 mol %, with less than or equal to 85 mol % more preferred.

Trifluoroethylene preferably comprises up to 90 mol % of the total ferroelectric polymer. Within this range, a trifluoroethylene concentration of greater than or equal to 10 mol % can be employed, with greater than or equal to 20 mol % preferred. Also preferred within this range is a trifluoroethylene concentration of less than or equal to 50 mol %, with less than or equal to 30 mol % more preferred. Hexafluoropropylene preferably comprises up to 50 mol % of the total weight of the ferroelectric polymer. A hexafluoropropylene concentration of greater than or equal to 10 mol % can be employed, with greater than or equal to 15 mol % preferred.

The polymerization conditions to provide these polymers or prepolymers are well known. A small amount of an initiator, such as an organic peroxide may be present. Once polymerization has occurred, the un-reacted monomers may be removed, for example heating, by placing the polymer under a vacuum, by washed with an appropriate solvent, or a combination comprising at least one of the foregoing purification steps. The ferroelectric polymers or prepolymers used to form the films generally have a molecular weight of 5 to 250 kiloDaltons (kDa). Within this range, a molecular weight of greater than or equal to 20 kDa, preferably greater than 30 kDa can be employed, with less than or equal to 80 kDa preferred, and less than or equal to 60 kDa more preferred. Suitable ferroelectric polymers are commercially available, for example the co-(vinylidene fluoride trifluoroethylene) is available from Solvay Corporation.

Formulations comprising precursor compositions may contain surface active agents to improve coating properties. The surface active agent may include, e.g., polyoxyethylene lauryl ether, polyoxyethylene octyl phenyl ether, polyoxyethylene nonyl phenyl ether, polyoxyethylene glycol dilaurate, polyoxyethylene glycol distearate, as well as organofluoro surfactants including those available commercially under the trade names Megafax F171, F172, F173, F471, R-07, R-08, (available from Dainippon Ink & Chemicals, Incorporated), Fluorad FC171, FC430, FC431 (available from 3M Corporation), ASAHI GUARD AG710, Surflon S-382, SC-101, SC-102, SC-103, SC-104, SC-105, SC-106 (available from Asahi Glass Co., Ltd.), KP341 (available from Shin-Etsu Chemical Co., Ltd.), Polyflow No. 75, No. 95 (available from Kyoeisha Chemical Co., Ltd.), Silwet L-7604 (available from Witco Chemical Corp.), and NBX-7, NBX-8, NBX-15 (available from NEOS Company Limited).

The ferroelectric polymer films may be formed from the precursor compositions by wet processes using solvents, dispersions and the like. Such processes include casting, blade coating, roll coating, spin coating, dipping, and spray coating, as well as printing methods such as lithography, relief printing, intaglio, perforated plate printing, screen-printing, and transfer printing. Still other wet processes of forming ferroelectric films include electrochemical methods such as electrodeposition, electropolymerization, micelle electrolysis (see, for example, JP-A-63-243298), Langmuir blow-jet methods using monomolecular films formed on water, and the like. The process by which the ferroelectric polymer precursors are formed into films can also include a combination comprising at least one of the foregoing processes, spin coating methods being more preferred.

Such processes require use of a solvent composition, which is subsequently removed. Suitable solvent compositions may comprise a single solvent or a mixture of miscible solvents, and are those that dissolve and retain the polymer in solution, preferably with other solutes that may be present in the precursor composition, through a range of concentrations. Preferably, the solvent is effective to provide a solution comprising at least 4 wt % of the precursor composition, preferably greater than 8 wt %, and more preferably greater than 10 wt %, exclusive of components intended to be insoluble, for example particulate inorganic fillers. The solvent furthermore is one that evaporates to form a smooth, preferably defect-free film. In addition it is preferable from a manufacturing standpoint that the solvent not pose a significant health or safety hazard to users, for example by having a flashpoint higher than 38° C. (100° F.).

It has been discovered by the inventors hereof that appropriate selection of a solvent composition can be used to control the properties of the film formed from the precursor compositions. While the actual values of solvent parameters may depend on their method of determination, it has been discovered that a set of such parameters, when measured in a consistent manner, can be used to select solvent compositions that will allow adjustment of film properties. One source of such parameters is the Texaco Solvent Characteristics Chart, which is shown in FIG. 1, and which is available from the Texaco Chemical Company. Another convenient source of solubility parameters is found in the *CRC Handbook of Solubility Parameters and Other Cohesion Parameters,* 2nd Ed by Barton (CRC Press, (1991)). It is to be understood that parameters derived from one reference may not necessarily be commingled with those from another, unless the two were determined in comparable ways.

In particular, it has been found that appropriate selection of the polar characteristics and polarizability (i.e., dispersive characteristics) of a solvent composition allows adjustment of the morphology of the resulting ferroelectric film. The selection is made in accordance with the Pythagorean sum of the Hansen dispersive solubility parameter ($\delta_d$) and the Hansen polar solubility parameter ($\delta_p$), which is conveniently represented herein as $\delta_v$, and is represented by Equation (I):

$$\delta_v = (\delta_d^2 + \delta_p^2)^{1/2} \tag{Eq. I}.$$

Using values from the Texaco table, preferred solvent compositions for forming solutions of comprising ferroelectric polymer film precursor solutions have a $\delta_v$ of greater than or equal to 8.5 (calories per cubic centimeter)$^{1/2}$ [(cal/cc)$^{1/2}$], preferably of 8.5 to 15 (cal/cc)$^{1/2}$. Within this range a $\delta_v$ of less than or equal to 13.5 (cal/cc)$^{1/2}$ can be employed, with less than or equal to 12.5 (cal/cc)$^{1/2}$ preferred. Also preferred within this range is a $\delta_v$ of greater than or equal to 8.6 (cal/cc)$^{1/2}$. Use of a solvent having a δv value of greater than or equal to 8.5 provides a predictor of solubility as well as solvent properties. As mentioned above, the particular value for $\delta_v$ to achieve a particular result may vary depending on the source of the data used in Equation I. When a mixture of solvents is used, the $\delta_v$ is determined by using the weighted average of the respective $\delta_p$ and $\delta_d$ values for each solvent, based on the volume % of each component in the solvent. Once the values of $\delta_p$ and $\delta_p$ are obtained, $\delta_v$ for the mixture is computed as the Pythagorean sum.

In addition to solubility, useful casting solvents frequently exhibit boiling points greater than or equal to 100° C. Accordingly solvents and solvent mixtures with boiling points greater than or equal to 100° C. are preferred. In addition, useful casting solvents that give low-defect films usually have relative evaporation rates at 25° C. equal to or less than 1 compared to n-butyl acetate. Accordingly, solvents with evaporation rates at 25° C. less than 1 compared to n-butyl acetate are preferred. Further, despite the fact that some chlorinated solvents such as chlorobenzene, dichloromethane, chloroform and carbon tetrachloride have values of $\delta_v$ greater than 8.5, the polymers of this invention do not dissolve easily in chlorinated solvents. Accordingly, solvents comprising non-chlorinated solvents are also preferred.

Preferred solvents include formamide, ethylene carbonate, dipropylene glycol, gamma-butyrolactone, dimethyl sulfoxide, acetonitrile, n-butyl benzyl phthalate, diethylene glycol, dimethyl phthalate, acetophenone, methoxypropyl acetamide, N,N-dimethylacetamide, ethylene glycol, ethyl cinnamate, diethyl phthalate, N-methylmorpholine, benzonitrile, ethylene glycol 2-ethylhexyl ether, benzyl alcohol, morpholine, ethylene glycol diacetate, propylene glycol, 1,4-dioxane, furfuryl alcohol, cyclohexanone, propylene glycol butyl ether, ethylene glycol monoethyl ether, diethylene glycol ethyl ether, ethylene glycol ethyl ether, ethyl-3-ethoxypropionate, ethylene glycol methyl ether, propyleneglycol methyl ether, N-ethylmorpholine, methyl n-propyl ketone, mesitylene, diethylene glycol ethyl ether acetate, diethyleneglycol methyl ether, cyclohexanol, 4-methyl-3-penten-2-one, 2-methyl-2,4-pentanediol, ethyl benzene, 1-decanol, 1-isopropyl-2-methylimidazole, ethyl lactate, 2-hexyl acetate, diethylene glycol butyl ether acetate, diethylketone, 1-methoxy-2-butanol, diethylene glycol butyl ether, or a combination comprising at least one of the foregoing solvents.

Adhesion promoters such as hexamethyldisilazane, trimethylsilyl diethylamine, N-(n-butyl)-3-aminopropyltrimethoxysilane, 2-aminoethyltrimethoxysilane, 3-aminopropyltriethoxysilane, N-methyl-δ-aminopropyltrimethoxysilane, triamino-modified propyltrimethoxysilane (e.g. the adhesion promoter available under the trade name Dynasylan-Triamo, commercially available from Dynamit Nobel Chemie) may be used. In addition, adhesion layers such as acrylics and polyesters may be used to promote adhesion between the active ferroelectric and the substrate and the active ferroelectric and the top conductor electrode. Accordingly, a solution of low molecular weight poly methylmethacrylate poly methylacrylate or poly ethylene terephthalate can be used to deposit an adhesion promoting layer by, for example, spin coating.

Films formed from solvent compositions within these parameters have improved properties that may be adjusted depending on the desired end use. As shown in FIG. 2, the films have an average roughness, as measured as a mean-square deviation using atomic force microcopy (AFM) of 300 angstroms (Å) or less, with less than or equal to 150 preferred, less than or equal to 100 more preferred, and less than or equal to 75 Å most preferred. As may be seen from FIG. 2, for example, films of the present invention have a decreased roughness, which is desirable for reproducibility, reliability, reduced polling fatigue, good electrode contact, and dense packing in data processing devices.

In addition, the ferroelectric polymer film has an average crystal domain size, as measured by AFM, of 1 to 10 nanometers. Within this range, an average domain size of less than or equal to 8 nanometers is preferred, with less than or equal to 6 nanometers more preferred, and less than or equal to 2 nanometers most preferred. Again, as may be seen from FIG. 2, films of the present invention have decreased average domain sizes, which is desirable for reproducibility, reliability, reduced polling fatigue, and for providing good electrode contact and dense packing in data processing devices.

A variety of other film properties may be adjusted by appropriate selection of the solvent composition, including polydispersity, properties related to hysteresis (e.g., saturation potential, coercive field strength, and permittivity); reliability (e.g., fatigue, aging, time dependence dielectric breakdown, imprint, and relaxation); kinetic properties (e.g., ferroelectric switching time); and thermodynamic properties (e.g., Curie transition temperature of the film).

The ferroelectric polymer films can have a polydispersity of 1.0 to less than or equal to 3, preferably less than or equal to 2, with less than or equal to 1.5 more preferred, and less than or equal to 1.2 most preferred.

Hysteresis, the observed lagging or retardation of the polarization effect when the electric field acting upon a ferroelectric polymer film is changed from a condition previously induced, can be shown graphically in a plot of the observed polarization (P) verses the magnitude of the applied electric field (E), as shown in the hysteresis loop plot of FIG. 3. The shape and magnitude of a hysteresis loop are characteristic of a particular ferroelectric material. For example, starting at point 2, as the electric field is increased, the crystalline domains of the film become oriented with the field. When no further reorientation can occur, the curve becomes flat. The polarization value at the intersection of a line extrapolated to the polarization axis at E=0 (line 4 of FIG. 3), is the saturation polarization (designated $P_{sat}$, point 6 of FIG. 3). The magnitude of the polarization at E=0 on the hysteresis loop (point 8 of FIG. 3) is the remnant polarization (designated $P_r$).

In terms of a ferroelectric polymer film, polling fatigue refers to a decrease in the remnant polarization during repeated cycling of the hysteresis curve at a given drive amplitude. For example, at a drive amplitude of 100 MV/m, full scale (Coercive field strength, Ec, of 50 MV/m), the remnant polarization can be reduced by 80–90% of its unpolled value in 100 cycles. Preferably the reduction in remnant polarization should be no more than 70% in 100 cycles at Ec=50 MV/m. Within the range of 0–70%, a reduction in remnant polarization of no more than 60% is more preferred, while a reduction of no more than 50% is most preferred.

Alternatively, the difference between the remnant polarization and the saturation polarization of the ferroelectric polymer film, as measured according to Fedosov, (see Electrical Properties of Ferroelectric Polymers During the Switching of Polarization, Sergiy Fedosov; http://www.tu-darmstadt.de/fb/ms/fg/em/ Ferroelektrika .pdf),is 0.1 to 70 millicoulombs per square meter ($mC/m^2$). Within this range, a difference of less than or equal to 50 $mC/m^2$ is preferred, and less than or equal to 25 $mC/m^2$ more preferred. The coercive field strength is defined as the horizontal intercept of the hysteresis loop (designated $E_c$, point 10 of FIG. 3). Preferably the ferroelectric polymer film has a coercive field strength of 20–80 mega Volts per meter (MV/m) consistent with a more square hysteresis loop, as compared to, for example, pure vinylidene fluoride polymers. Also, the ferroelectric polymer film preferably has a coercivity field strength as measured according to Christie et al., J. Polymer Sci.: Part B, Vol. 35, p. 2671, (1997) of 20 to 80 MV/m. Within this range, a coercivity field strength of greater than or equal to 30 MV/m is preferred, and greater than or equal to 40 MV/m more preferred. Another property of ferroelectric polymer films is differential permittivity, which is the slope of the hysteresis loop measured at any point on the curve. The differential permittivity of the ferroelectric material at $E_c$ is preferably 0.5 to 15 nanocoulombs per meter per volt (nC/m*V). Within this range, a differential permittivity of greater than or equal to 1 is preferred, and greater than or equal to 2.5 nC/m*V more preferred.

As is known, the ferroelectric properties of a polymer film can be lost by transforming the polymer from its ferroelectric state into its paraelectric state. These same properties can be made to reappear upon subsequent conversion of the polymer back into a ferroelectric state. Such changes in thermodynamic states can be brought about by changes in temperature. The Curie transition temperature, often abbreviated as Tc, is the temperature at which this change occurs. The Curie transition temperature of the ferroelectric polymer film is preferably 90 to 145° C. Within this range, a Curie transition temperature of greater than or equal to 100° C. is preferred, and greater than or equal to 110° C. more preferred.

In practice, the ferroelectric polymer film precursor composition is dissolved in the solvent composition, and the film is formed by one or more of the above-described film-forming methods. For example, in spin casting, a solution comprising 1 to 10 weight percent (wt %) of the film forming polymer and optional additives is applied to a substrate rotating at 500 to 10,000 revolutions per minute (RPM) at a temperature of 15 to 30° C. The spin-coated film is then heated, e.g., baked on a hotplate, at 80 to 120° C.

The ferroelectric polymer film may be used in the form in which it was originally prepared, or it may undergo additional processing steps, for example crosslinking, irradiation with an electron beam having an energy greater than 5 kiloelectron volts (keV) and a dose greater than 0.5 micro Curies per square centimeter ($\square C/cm^2$), or irradiation with x-radiation having a wavelength of less than 20 nm and a dose greater than 1 milli Joule square centimeter ($mJ \cdot cm^2$). The film may also be stretched along one or more axes; heat treated by, e.g., annealing, at a temperature of from 100° C. to 130° C., for 1 minute to 12 hours; the film may be coated with a conducting or semiconducting passivation layer such as colloidal graphite, a conducting polymer such as partially ionized polythiophene, poly(3,4-ethylene dioxythiophene)-poly(styrenesulphonate) (PEDOT-PSS, supplied by Bayer AG), or partially ionized polyaniline, or evaporated small molecules such as 2-amino-1H-imidazole-4,5-dicarbonitrile, and evaporated donor-accepter complexes such as tetrathiafulvalene-tetracyanoquinodimethane or may have an inorganic layer such as indium-tin oxide. The additional conditioning steps may also include any combination comprising at least one of the foregoing treatments.

The thickness of the ferroelectric polymer film is dependent on the final application. For example, when the ferroelectric polymer film is to be used in a data processing device, the film preferably has a thickness of 15 to 300 nm. Within this range, a thickness of greater than or equal to 20 nm is preferred. Also preferred within this range is a thickness of less than or equal to 50 nm with less than or equal to 25 nm more preferred.

The ferroelectric polymer film is preferably used in a data processing device, including, for example, a logic element configured memory cells as described in United States Patent Application No. US 2002/0044480 to Gudesen et al. For example, a data storage device wherein a ferroelectric polymer film is located preferably as a continuous layer or sheet between a first and a second electrode structure of strip electrodes. The first and the second electrode structure are dimensioned, located and positioned to form a two-dimensional x, y-matrix with, for example, the x electrodes being columns in the matrix, and the y electrodes being rows in the matrix. The portion of the ferroelectric polymer film at an intersection between an x electrode and a y electrode of the electrode matrix forms a logic element electrically connected to respective driver and control circuits for driving the electrodes and detection of output signals, thus forming the data processing device.

The disclosure is further illustrated by the following non-limiting example.

A copolymer comprising 78 mol % vinylidene fluoride and 22 mol % trifluoroethylene was dissolved at a concentration of 5% by weight, based on the total weight of the solution in the solvents shown in the Table. The solutions were filtered through a 0.2 micrometer filter and spin-cast on silicon wafers that had been previously primed with hexamethyldisilazane as an adhesion promoter AFM measurements were made on a 20×20 micrometer portion of the film to determine morphology. Results are shown in FIG. 2.

As shown in FIG. 2, samples spin cast using propylene glycol methyl ether acetate (PGMEA), which has a $\delta_v$ of 9.08 (cal/cc)$^{1/2}$ produces films having a roughness of less than 10 nm and a small average crystal domain size of less than 5 nm. The film produced using ethyl lactate, which has a $\delta_v$ of 8.63 (cal/cc)$^{1/2}$ also produces films having a roughness of less than 10 nm and a small average crystal domain size of less than 5 nm. Both of these films are improved relative to comparative examples, which were films cast from 2-heptanone (methyl-n-amyl ketone), $\delta_v$ of 8.35 (cal/cc)$^2$, and diethyl carbonate, $\delta_v$ of 8.24 (cal/cc)$^2$.

What is claimed is:

1. A process of forming a ferroelectric polymer film comprising:
    (a) disposing a solution comprising a ferroelectric polymer film precursor composition and a solvent composition onto a substrate, wherein the solvent composition comprises ethyl lactate and has a $\delta_v$ value of greater than or equal to 8.5 (cal/cc)$^{1/2}$, wherein $\delta_v=(\delta_d^2=\delta_p^2)^{1/2}$, $\delta_d$ being a Hansen derivative solubility parameter $\delta_p$ being a Hansen polar solubility parameter, and
    (b) removing at least a position of the solvent to produce a ferroelectric polymer film; and
    (c) irradiating the film with an electric beam.

2. The process of claim 1, wherein the precursor composition comprises a vinylidene fluoride-containing polymer.

3. The process of claim 2, wherein the vinylidene fluoride-containing polymer that comprises:
    50 to 90 mol % of vinylidene fluoride; and
    10 to 50 mol % of trifluoroethylene.

4. The process of claim 1, wherein the solvent composition has a boiling point above 100° Celsius.

5. The process of claim 1, wherein the solvent composition has a relative evaporation rate at 25° C. of less than or equal to 1 compared to n-butyl acetate.

6. The process of claim 1, wherein the ferroelectric polymer film has an atomic force microscopy roughness of 10 to 100 Angstroms.

7. The process of claim 1, wherein the ferroelectric polymer film comprises crystalline domains having an average size of 1 to 10 nanometers.

8. The process of claim 1, wherein the ferroelectric polymer film has a coercivity field strength of 20 to 80 MV/m.

9. The process of claim 1, wherein the ferroelectric polymer film has a polling fatigue that is no more than 70% of 100 cycles at a drive amplitude of 100 MV/m.

10. The process of claim 1, wherein the ferroelectric polymer has a differential permittivitiy or 0.5 to 15 nC/m*V.

11. The process of claim 1, wherein the ferroelectric polymer film has a Curie transition temperature of 90 to 145 degrees Celsius.

12. The process of claim 1, wherein the solvent composition further comprises one or more solvents selected from the group consisting of formamide, ethylene carbonate, dipropylene glycol, gamma-butyrolactone, acetonitrile, n-butyl benzyl phthalate, diethylene glycol, dimethyl phthalate, acetophenone, methoxypropyl acetamide, ethylene glycol, ethyl cinnamate, diethyl phthalate, N-methylmorpholine, benzonitrile, ethylene glycol 2-ethylhexyl ether, benzyl alcohol, morpholine, ethylene glycol diacetate, propylene glycol, 1,4-dioxane, furfuryl alcohol, cyclohexanone, propylene glycol butyl ether, ethylene glycol monoethyl ether, diethylene glycol ethyl ether, ethylene glycol ethyl ether, ethyl-3-ethoxypropionate, ethylene glyocol methyl ether, propylene glycol methyl ether, propylene glycol methyl ether acetate, N-ethylmorpholine, methyl n-propyl ketone, mesitylene, diethylene glycol ethyl ether acetate, diethylene glycol methyl ether, cyclohexanol, 4-methyl-3-penten-2-one, 2-methyl-2,4-pentanediol, ethyl benzene, 1-decanol, 1-isopropyl-2-methylimidazole, 2-hexyl acetate, diethylene glycol butyl ether acetate, diethyl ketone, 1-methoxy-2-butanol, and diethylene glycol butyl ether.

13. The process of claim 1, wherein the solvent composition further comprises one or more solvents selected from the group consisting of ethylene carbonate, dipropylene glycol, gamma-butyrolactone, acetonitrile, n-butyl benzyl phthalate, diethylene glycol, dimethyl phthalate, acetophenone, methoxypropyl acetamide, ethylene glycol, ethyl cinnamate, diethyl phthalate, N-methylmorpholine, benzonitrile, ethylene glycol 2-ethylhexyl ether, benzyl alcohol, morpholine, ethylene glycol diacetate, propylene glycol, 1,4-dioxane, furfuryl alcohol, cyclohexanone, propylene glycol butyl ether, propylene glycol methyl ether acetate, ethylene glycol monoethyl ether, diethylene glycol ethyl ether, ethylene glycol ethyl ether, ethyl-3-ethoxypropionate, ethylene glyocol methyl ether, propylene glycol methyl ether, N-ethylmorpholine, methyl n-propyl ketone, mesitylene, diethylene glycol ethyl ether acetate, diethylene glycol methyl ether, cyclohexanol, 4-methyl-3-penten-2-one, 2-methyl-2,4-pentanediol, ethyl benzene, 1-decanol, 1-isopropyl-2-methylimidazole, 2-hexyl acetate, diethylene glycol butyl ether acetate, diethyl ketone, 1-methoxy-2-butanol, and diethylene glycol butyl ether.

14. The process of claim 1, wherein the solvent composition comprises propylene glycol methyl ether acetate.

* * * * *